(12) United States Patent
Arima et al.

(10) Patent No.: US 8,398,319 B2
(45) Date of Patent: Mar. 19, 2013

(54) DEVELOPING APPARATUS, DEVELOPING METHOD, AND STORAGE MEDIUM

(75) Inventors: Hiroshi Arima, Koshi (JP); Yuichi Yoshida, Koshi (JP); Taro Yamamoto, Koshi (JP); Kousuke Yoshihara, Koshi (JP)

(73) Assignee: Tokyo Electron Limited, Minato-Ku (JP)

( * ) Notice: Subject to any disclaimer, the term of this patent is extended or adjusted under 35 U.S.C. 154(b) by 190 days.

(21) Appl. No.: 12/718,104

(22) Filed: Mar. 5, 2010

(65) Prior Publication Data

US 2010/0233637 A1   Sep. 16, 2010

(30) Foreign Application Priority Data

Mar. 13, 2009   (JP) .................... 2009-062087

(51) Int. Cl.
*G03D 5/00* (2006.01)
(52) U.S. Cl. ........................................ 396/611
(58) Field of Classification Search .......... 396/611
See application file for complete search history.

(56) References Cited

U.S. PATENT DOCUMENTS

| | | | | |
|---|---|---|---|---|
| 5,579,998 | A * | 12/1996 | Hall et al. | 239/9 |
| 6,082,377 | A * | 7/2000 | Frey | 134/6 |
| 2002/0094386 | A1 * | 7/2002 | Steiger | 427/421 |
| 2002/0182543 | A1 * | 12/2002 | Fujii | 430/302 |
| 2004/0250757 | A1 * | 12/2004 | Natsuyama et al. | 118/300 |
| 2008/0026153 | A1 * | 1/2008 | Hayashida et al. | 427/379 |
| 2009/0071940 | A1 * | 3/2009 | Miyagi et al. | 216/83 |
| 2010/0216077 | A1 * | 8/2010 | Nishi et al. | 430/325 |
| 2010/0233637 | A1 * | 9/2010 | Arima et al. | 430/325 |

FOREIGN PATENT DOCUMENTS

| | | |
|---|---|---|
| JP | 61-259522 A1 | 11/1986 |
| JP | 01-302725 A1 | 12/1989 |
| JP | 08-138997 A1 | 5/1996 |
| JP | 2000-232058 A1 | 8/2000 |
| JP | 2005-277268 | 10/2005 |

OTHER PUBLICATIONS

Chinese Office Action mailed Dec. 29, 2011.

\* cited by examiner

*Primary Examiner* — Clayton E LaBalle
*Assistant Examiner* — Bret Adams
(74) *Attorney, Agent, or Firm* — Burr & Brown

(57) ABSTRACT

A developing apparatus including a substrate holder that holds a substrate horizontally; means for atomizing a surface treatment liquid used to improve wettability of the substrate with a developer; a first spray nozzle that sprays the atomized surface treatment liquid onto the substrate; and a developer supply nozzle that supplies a developer onto the substrate to which the substrate treatment liquid has been sprayed. The surface tension of the atomized surface treatment liquid with respect to the substrate is lower than the surface tension of the surface treatment liquid with respect to the substrate. The atomization suppresses the fact that the surface treatment liquid gathers on a certain portion of the surface of the substrate. The surface treatment liquid can be easily supplied onto the entire surface of the substrate, and improve wettability of the substrate with the developer.

2 Claims, 15 Drawing Sheets

(a)

US 8,398,319 B2

DEVELOPING APPARATUS, DEVELOPING METHOD, AND STORAGE MEDIUM

CROSS-REFERENCE TO THE RELATED APPLICATION

The present application claims priority from Japanese application No. JP2009-062087, filed on Mar. 13, 2009, the content of which is hereby incorporated by reference into this application.

BACKGROUND OF THE INVENTION

1. Field of the Invention

The present invention relates to a developing apparatus that performs a development process on a substrate having a resist coated thereon and the resist exposed to light, and a developing method and a storage medium therefor.

2. Description of the Related Art

During a photoresist process that is one of semiconductor-manufacturing processes, a resist pattern is formed on semiconductor wafers (hereinafter, referred to simply as wafers) by coating the wafer surface with a resist and exposing the resist to light in the desired pattern, followed by development. Such a process is usually performed using a system that includes a coating and developing apparatus that performs a coating and development process and an exposure apparatus connected to the coating and developing apparatus.

The coating and developing apparatus includes a developing module (developing apparatus) that supplies a developer onto a wafer having a resist coated thereon to develop the wafer. The developing module includes a substrate holder and a developing unit. The substrate holder holds the wafer. The developing unit has a liquid discharge unit, a gas discharge unit and a cup body. The cup body surrounds the wafer held by the substrate holder. The developing module also includes a developer supply nozzle and a pure water supply nozzle. The developer supply nozzle supplies a developer onto the wafer, and the pure water supply nozzle supplies pure water onto the wafer.

The following briefly describes a process to be performed by the developing apparatus. First, the pure water supply nozzle supplies pure water onto a central portion of the surface of the wafer rotating about a vertical axis through the substrate holder. The pure water spreads toward a peripheral edge portion of the surface of the wafer from the central portion of the surface of the wafer under the centrifugal force of the rotating wafer. In this way, a pre-wetting process is performed to make the surface of the wafer wet in order to improve wettability of the surface of the wafer with the developer that is used in a development process. In the pre-wetting process, a developer may be used instead of the pure water. In such a case, the developer is used not for development but for improvement in wettability of the surface of the wafer with the developer when a liquid film is formed.

Recently, an exposure apparatus that performs immersion exposure has been widely used. With this trend, a resist having a higher water-repellent property has been used in order to suppress an effect of a liquid used for immersion exposure. When such a resist having a high water-repellent property is to be developed, due to surface tension of the developer or pure water, the developer or pure water tends to gather in a region having high wettability on the surface of the wafer during the pre-wetting process and liquid film formation.

Specifically, when the pre-wetting process starts and the pure water spreads from a central region of the surface of the wafer to a peripheral edge portion thereof, wettability in a region that is wet with the pure water on the surface of the wafer is improved. However, wettability in a region to which the pure water is not supplied on the surface of the wafer is low. Once a region having high wettability is formed on the surface of the wafer, the pure water will move to the region having high wettability with the pure water due to the surface tension of the pure water even if the pure water is further supplied onto the surface of the wafer. Then, the pure water will pass through the region having high wettability with the pure water and fall out of a peripheral edge portion of the wafer. As a result, a region having low wettability with the pure water does not become wet with the pure water, ending the pre-wetting process. Next, when the developer is supplied after termination of the pre-wetting process, although the developer spreads to the region having high wettability, the developer does not spread to the region having low wettability due to the surface tension of the developer, as is the case with the pure water supplied in the pre-wetting process. Thus, the region having low wettability in question is not subjected to development process.

The size of the wafer tends to be increased in order to improve the throughput and a 450 mm diameter wafer is studied nowadays. When such a large wafer is used, the wafer may have many regions to which a developer is not applied, resulting in possibly development failure.

Instead of a process for supplying a developer onto the surface of a rotating wafer, the following developing method may be performed. A developer nozzle having a slit-like port, which extends across the diameter of a wafer, supplies a developer onto the surface of the wafer while moving from one end to the other end of the wafer that is in a stationary state so that a liquid film made of the developer is formed on the wafer. After that, the wafer is kept stationary. However, when a resist is highly water-repellent, it may be difficult to uniformly form the liquid film for the aforementioned reasons even when this developing method is used.

In order to uniformly form a liquid film on the wafer, increasing the amount of the developer to be supplied onto the wafer may be adopted. This scheme, however, increases the time for the development process, resulting in reduced throughput and high cost.

Although JP-A-2000-232058 describes a developing apparatus that sprays an atomized developer, it does not discuss the problems described above; therefore such problems cannot be solved.

SUMMARY OF THE INVENTION

The present invention has been made to address the problems. An object of the present invention is to provide a developing apparatus adapted to supply a developer onto a substrate in a highly uniform manner and can suppress a reduction in yield of wafers, and a developing method and a storage medium therefor.

According to an embodiment of the present invention, a developing apparatus comprises:

a substrate holder that holds a substrate, the substrate being prepared by coating a surface of the substrate with a resist and exposing the resist-coated substrate to light, such that the substrate is horizontally oriented;

means for atomizing a surface treatment liquid used to improve wettability of the substrate with a developer;

a first spray nozzle that is connected to the surface treatment liquid atomizing means, the first spray nozzle spraying the atomized surface treatment liquid onto the substrate; and a developer supply nozzle that is located above the substrate held by the substrate holder, the developer supply nozzle supplying the developer for development onto the substrate to which the substrate treatment liquid has been sprayed.

The developing apparatus further may include:

a cleaning nozzle that is located above the substrate held by the substrate holder, the cleaning nozzle supplying a cleaning liquid onto the substrate to which the developer has been supplied to clean the substrate; and a control unit that controls an operation of the developer supply nozzle and an operation of the cleaning nozzle;

wherein the control unit controls the developer supply nozzle and the cleaning nozzle so that a step of supplying the developer from the developer supply nozzle onto the substrate and a step of supplying the cleaning liquid from the cleaning nozzle onto the substrate are alternately repeated.

According to an embodiment of the present invention, a developing apparatus comprises:

a substrate holder that holds a substrate, the substrate being prepared by coating a surface of the substrate with a resist and exposing the resist-coated substrate to light, such that the substrate is horizontally oriented;

means for atomizing a surface treatment liquid used to improve wettability of the substrate with a developer;

a first spray nozzle that is connected to the surface treatment liquid atomizing means, the first spray nozzle spraying the atomized surface treatment liquid onto the substrate;

means for atomizing the developer; and a second spray nozzle that is connected to the developer atomizing means, the second spray nozzle spraying the atomized developer for development onto the substrate.

The developing apparatus may further include:

a cleaning nozzle that is located above the substrate held by the substrate holder, the cleaning nozzle supplying a cleaning liquid onto the substrate to which the developer has been supplied to clean the substrate; and a control unit that controls an operation of the second spray nozzle and an operation of the cleaning nozzle, wherein the control unit controls the second spray nozzle and the cleaning nozzle so that a step of supplying the atomized developer from the second spray nozzle onto the substrate and a step of supplying the cleaning liquid from the cleaning nozzle onto the substrate are alternately repeated.

The developing apparatus may be configured so that a static contact angle of the surface of the substrate with respect to water is 80 degrees or more.

According to an embodiment of the present invention, a developing method comprises the steps of:

providing a substrate;

coating a surface of the substrate with a resist and exposing the resist-coated substrate to light;

holding the thus-formed substrate so as to be horizontally oriented;

atomizing a surface treatment liquid used to improve wettability of the substrate with a developer;

spraying the atomized surface treatment liquid onto the substrate from a first spray nozzle; and supplying, from a developer supply nozzle, the developer for development onto the substrate to which the surface treatment liquid has been sprayed.

The developing method may be performed so that the step of supplying the developer onto the substrate from the developer supply nozzle and the step of supplying the cleaning liquid onto the substrate from a cleaning nozzle to clean the substrate are alternately repeated.

According to an embodiment of the present invention, a developing method comprises the steps of:

providing a substrate;

coating a surface of the substrate with a resist and exposing the resist-coated substrate to light;

holding the thus-formed substrate so as to be horizontally oriented;

atomizing a surface treatment liquid used to improve wettability of the substrate with a developer;

spraying the atomized surface treatment liquid onto the substrate from a first spray nozzle;

atomizing the developer; and spraying the atomized developer for development onto the substrate from a second spray nozzle.

The developing method may be performed so that the step of spraying the atomized developer onto the substrate from the second spray nozzle and the step of supplying the cleaning liquid onto the substrate from a cleaning nozzle to clean the substrate are alternately repeated.

According to an embodiment of the present invention, a storage medium has a computer program stored thereon, the program being used for a developing apparatus that performs a development process on a substrate, wherein the computer program is designed to perform a developing method, the method comprising the steps of:

providing a substrate;

coating a surface of the substrate with a resist and exposing the resist-coated substrate to light;

holding the thus-formed substrate so as to be horizontally oriented;

atomizing a surface treatment liquid used to improve wettability of the substrate with a developer;

spraying the atomized surface treatment liquid onto the substrate from a first spray nozzle; and supplying, from a developer supply nozzle, the developer for development onto the substrate to which the surface treatment liquid has been sprayed.

According to the present invention, the developing apparatus includes: the means for atomizing the surface treatment liquid used to improve the wettability of the substrate with the developer; and the first spray nozzle that sprays the atomized surface treatment liquid onto the substrate. The surface tension of the atomized surface treatment liquid on the substrate is lower than that of the not-atomized surface treatment liquid on the substrate. Therefore, the atomization suppresses the fact that the surface treatment liquid gathers on a certain portion of the surface of the substrate. Thus, the atomized surface treatment liquid can be easily supplied onto the entire surface of the substrate, and the wettability of the substrate can be improved. As a result, since the developer can be supplied on the substrate in a highly uniform manner, a development failure can be suppressed, and a reduction in yield of wafers can be suppressed.

DESCRIPTION OF THE PREFERRED EMBODIMENTS

Figure 1:
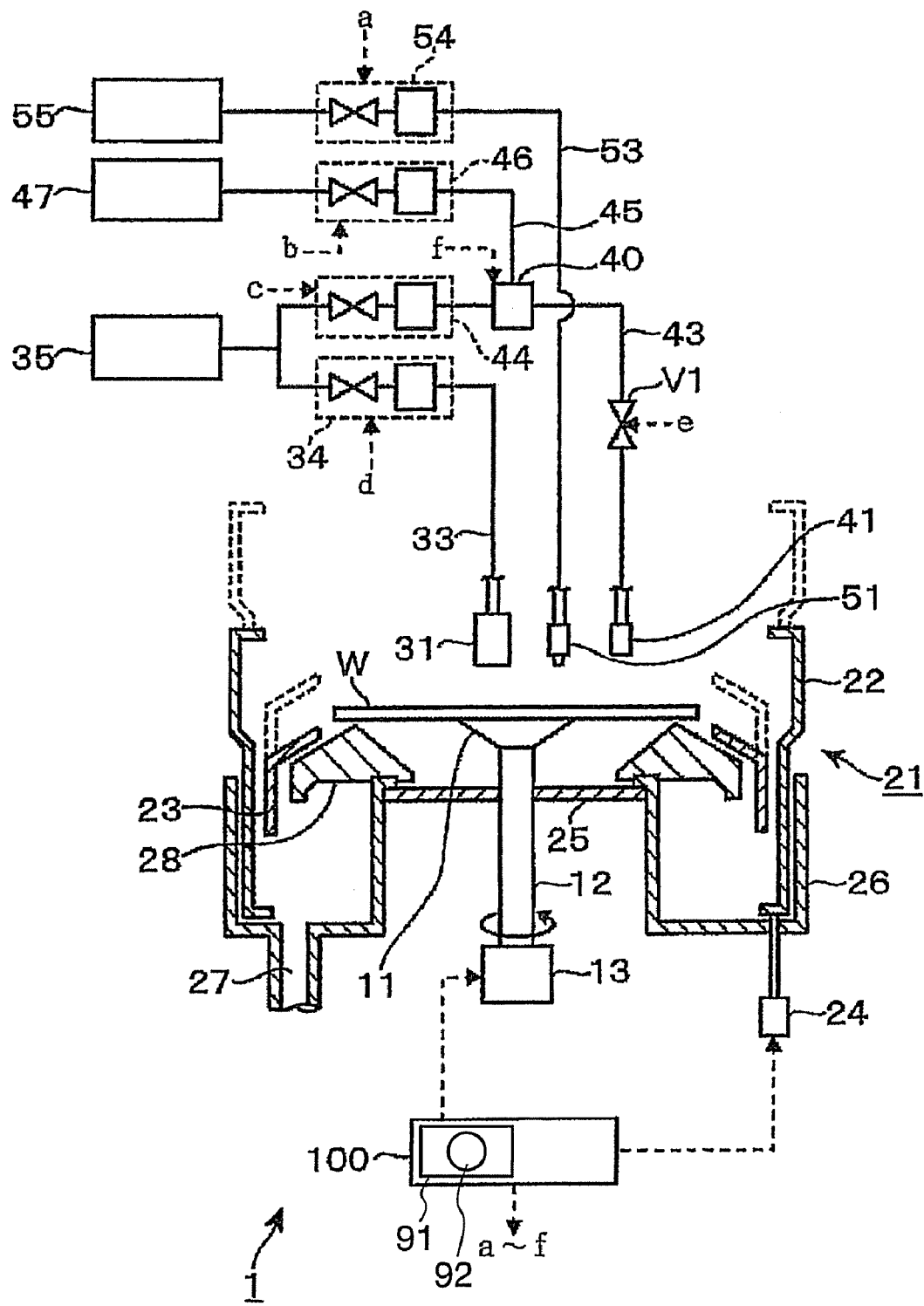
FIG. 1 is a vertical cross sectional view of a developing apparatus according to an embodiment of the present invention.

A developing apparatus 1 that performs a developing method according to the present invention is described below with reference to FIGS. 1 and 2. The developing apparatus 1 has a spin chuck 11 which sucks a central portion of a back surface of a wafer W so that the wafer W is held by the spin chuck 11 so as to be horizontally oriented. The spin chuck 11 is connected to a driving mechanism 13 through a rotary shaft 12. The center of the wafer W is located on a vertical rotational axis of the spin chuck 11. The spin chuck 11 is capable rotating around the vertical rotational axis and being moved up and down by the driving mechanism 13 while holding the wafer W. The rotational rate of the spin chuck 11 during a development process is controlled by means of a control signal output from a controller 100 (described later).

A cup body 21 is open on an upper side thereof and surrounds the wafer W located on the spin chuck 11. The cup body 21 includes an outer cup 22 and an inner cup 23. The outer cup 22 has a square shape on an upper side thereof and a cylindrical shape on a lower side thereof. The inner cup 23 has a cylindrical shape with its upper portion inwardly declined. A lower edge portion of the outer cup 22 is connected to a lifting section 24. The outer cup 22 is moved up and down by the lifting section 24. The outer cup 22 also has an inwardly-bent step portion formed on an inner circumferential surface of the outer cup 22 on the lower side of the outer cup 22. The inner cup 23 is capable of being moved up and down by means of the inwardly-bent step portion of the outer cup 22.

A disk-like plate 25 is provided under the spin chuck 11. A liquid receiver 26 surrounds the entire circumference of the disk-like plate 25 and is located on the outer side of the disk-like plate 25. The liquid receiver 26 is formed in a concave shape in a cross section thereof. The liquid receiver 26 has a discharge port 27 in a bottom thereof. A developer and a rinsed liquid fall from the wafer or are drained off from the wafer are stored in the liquid receiver 26. Thus-stored developer and rinsed liquid are then discharged from the discharge port 27 to the outside of the developing apparatus 1. A ring member 28 having a triangular shape in a cross section thereof is provided on the outer side of the disk-like plate 25. Three, for example, of lifting pin (not shown) each extends through the disk-like plate 25 and serves as a substrate holding pin are provided in the developing apparatus 1. The wafer W transferred into the developing apparatus 1 by a cooperative operation of both the lifting pins and a substrate transfer unit (not shown) is then transferred onto the spin chuck 11.

Figure 3A:
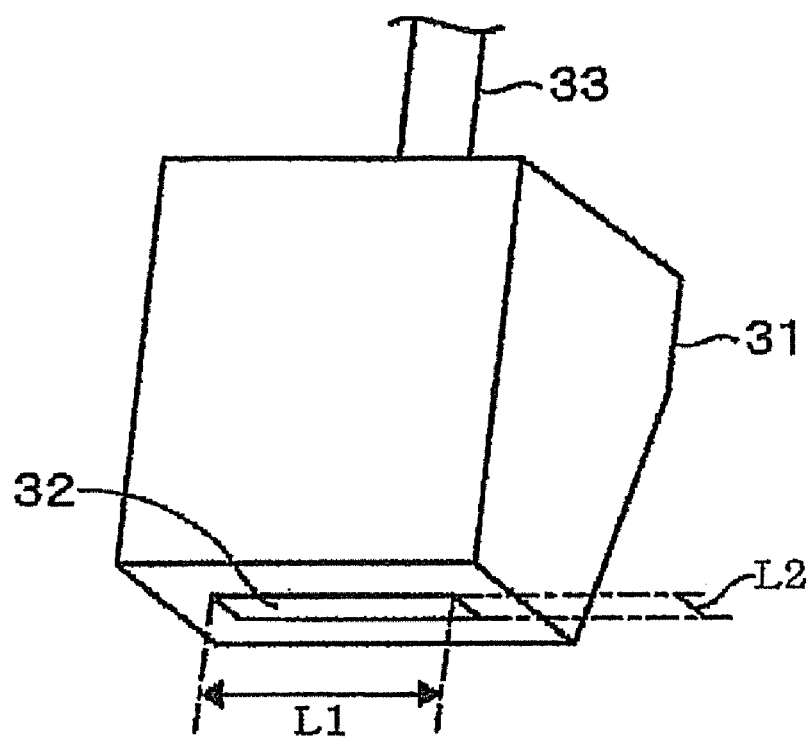
FIG. 3A is a perspective view of a developer supply nozzle included in the developing apparatus.

The developing apparatus 1 has a developer supply nozzle 31, an atomized developer spray nozzle 41 (that serves as a first spray nozzle), and a pure water supply nozzle 51 (that serves as a cleaning nozzle). Referring to FIG. 3A, the developer supply nozzle 31 has a slit-like port 32 in a lower surface thereof. The slit-like port 32 is downwardly open facing a front surface of the wafer W. The developer supply nozzle 31 performs band application of a developer from the slit-like port 32 onto the front surface of the wafer W held by the spin chuck 11. A longer side of the port 32 extends from an edge portion of the surface of the wafer W to a central portion of the surface of the wafer W. The length L1 of the longer side of the slit-like port 32 is in a range of 8 mm to 15 mm, for example. The length L2 of a shorter side of the slit-like port 32 is in a range of 0.1 mm to 1 mm, for example. A distance between the port 32 and the wafer W is in a range of, for example, 1 mm to 20 mm when the port 32 supplies the developer onto the wafer W.

The developer supply nozzle 31 is connected to an end of a developer supply pipe 33. The other end of the developer supply pipe 33 is connected to a developer supply source 35 through a flow rate controller 34 that includes a valve, a mass flow controller, and the like. The flow rate controller 34 receives a control signal from the controller 100 and controls the start/stop of supplying of the developer, on the basis of the received signal, onto the wafer W from the port 32.

Figure 3B:
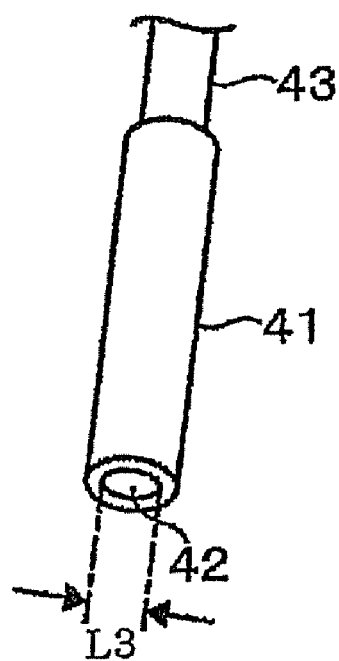
FIG. 3B is a perspective view of a spray nozzle included in the developing apparatus.

Referring to FIG. 3B, the atomized developer spray nozzle 41 has a circular pore-like port 42 in a lower edge portion thereof. The pore-like port 42 is downwardly open facing the front surface of the wafer W. The atomized developer spray nozzle 41 sprays an atomized developer onto the wafer held by the spin chuck 11. The diameter L3 of the port 42 is in a range of 10 mm to 30 mm, for example. The atomized developer spray nozzle 41 is connected to an end of an atomized developer supply pipe 43. The other end of the atomized developer supply pipe 43 is connected to the developer supply source 35 through a valve V1, an atomizing section 40 (surface treatment liquid atomizing unit) and a flow rate controller 44 in this order.

The atomizing section 40 is connected to an end of a gas supply pipe 45. The other end of the gas supply pipe 45 is connected to an $N_2$ gas supply source 47 through a flow rate controller 46. The $N_2$ gas supply source 47 stores an inert gas such as an $N_2$ gas. Each of the flow rate controllers 44 and 46 includes a valve, a mass flow controller, and the like. The flow rate controller 44 controls, on the basis of a control signal output from the controller 100, the flow rate of the developer that will flow to a downstream side of the flow rate controller 44. The flow rate controller 46 controls, on the basis of a control signal output from the controller 100, the flow rate of the $N_2$ gas that will flow to a downstream side of the flow rate controller 46. The valve V1 is controlled to be open and closed by means of a control signal output from the controller 100.

The atomizing section 40 has a tank and an oscillator. The tank stores the developer supplied from the developer supply source 35. The oscillator applies, on the basis of a control signal output from the controller 100, an ultrasonic wave or the like to the developer stored in the tank to generate an atomized developer. The diameter of a particle of the atomized developer is 3 μm or less, for example. The $N_2$ gas (carrier gas) supplied into the atomizing section 40 causes the atomized developer (generated by the atomizing section 40)

to flow through the atomized developer supply pipe 43 toward a downstream side of the pipe 43. The $N_2$ gas and the atomized developer are then supplied onto the wafer W from the spray nozzle 41.

The pure water supply nozzle 51 has a port 52 in a lower edge portion of the pure water supply nozzle 51. The port 52 is downwardly open. The pure water supply nozzle 51 supplies pure water onto the wafer W from the port 52. The pure water supply nozzle 51 is connected to an end of a pure water supply pipe 53. The other end of the pure water supply pipe 53 is connected to a pure water supply source 55 through a flow rate controller 54. The flow rate controller 54 includes a valve, a mass flow controller, and the like. The flow rate controller 54 receives a control signal from the controller 100 and controls start/stop of supplying of the pure water, on the basis of the received signal, onto the wafer W from the port 52. The port 52 included in the pure water supply nozzle 51 is formed in a pore-like shape in a similar way to the port 42 included in the atomized developer spray nozzle 41.

The developer supply nozzle 31 is held by a nozzle arm 15a on one end side of the nozzle arm 15a. The atomized developer spray nozzle 41 is held by a nozzle arm 15b on one end side of the nozzle arm 15b. The pure water supply nozzle 51 is held by a nozzle arm 15c on one end side of the nozzle arm 15c. The other ends of the nozzle arms 15a, 15b and 15c are connected to respective movable bodies 16a, 16b and 16c. Each of the movable bodies 16a, 16b and 16c has a lifting mechanism (not shown). The movable bodies 16a and 16c are capable of moving along a guide member 17a that extends in a horizontal direction. The movable body 16b is capable of moving along a guide member 17b that extends along the guide member 17a.

Figure 4A:
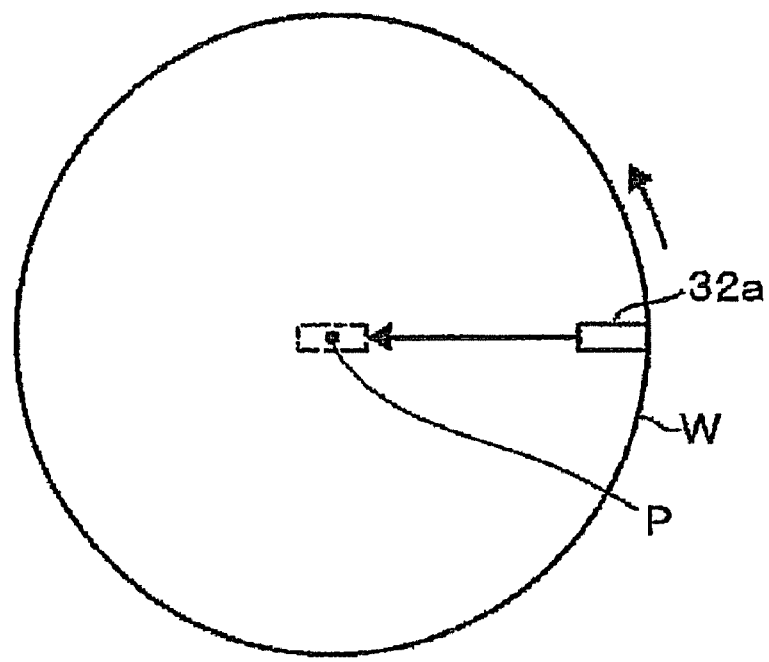
FIG. 4A is a diagram showing a movement of the developer supply nozzle.
Figure 4B:
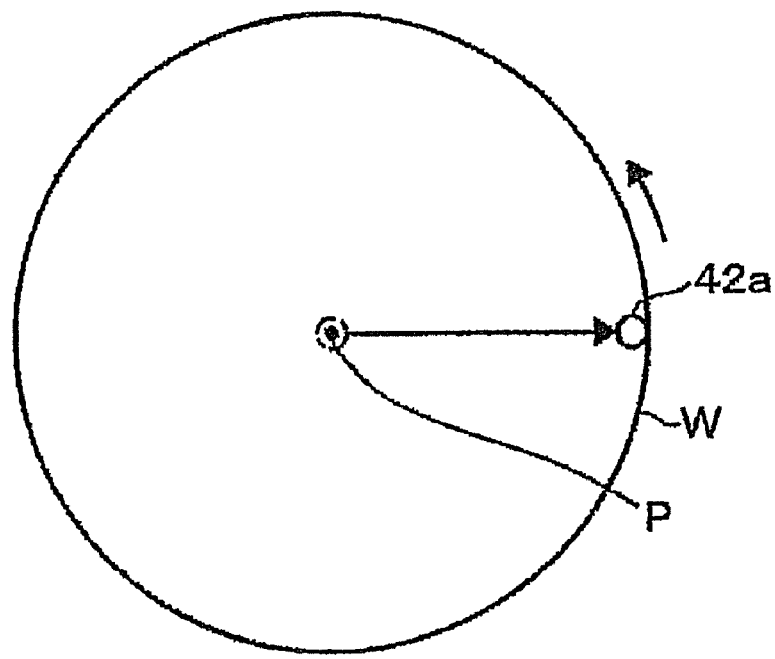
FIG. 4B is a diagram showing a movement of the spray nozzle.
Figure 5:
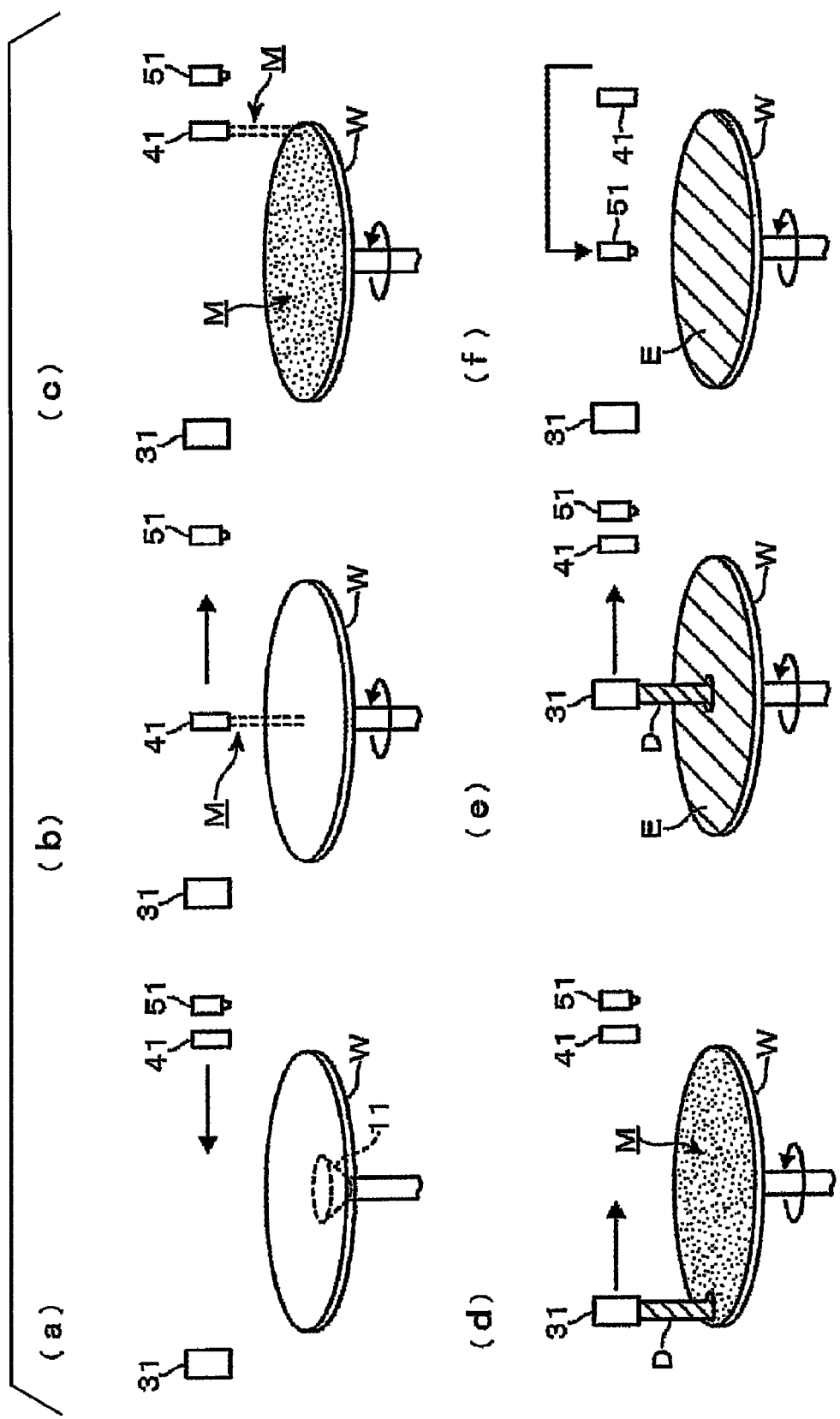
FIGS. 5(a) to 5(f) are diagrams showing a development process that is performed by the developing apparatus.
Figure 6:
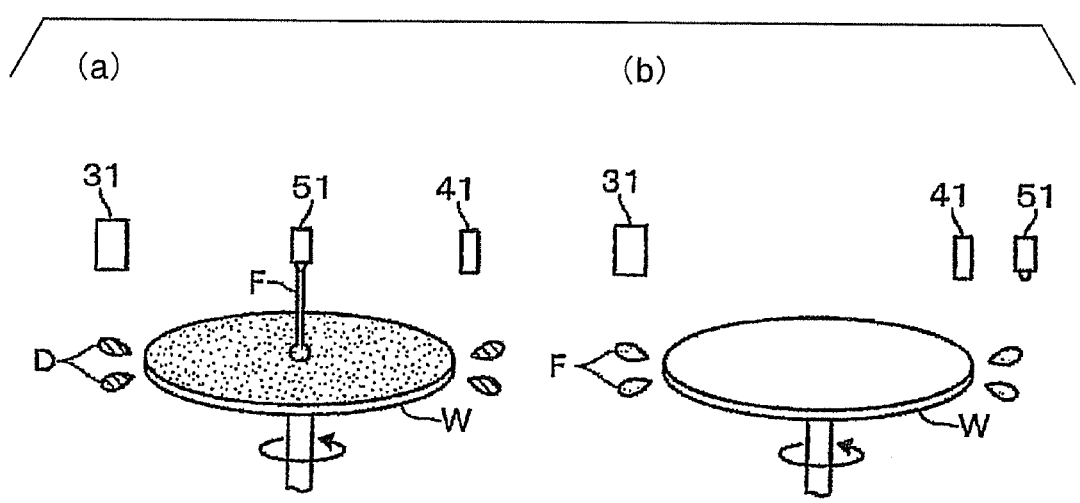
FIGS. 6(a) and 6(b) are diagrams showing the development process that is performed by the developing apparatus.

The movable body 16a can move the developer supply nozzle 31 so that a region (projection region) formed by projecting the port 32 on the surface of the wafer W held by the spin chuck 11 moves in the radial direction of the wafer W. The movable body 16b can move the atomized developer spray nozzle 41 so that a region (projection region) formed by projecting the port 42 on the surface of the wafer W held by the spin chuck 11 moves in the radial direction of the wafer W. The movable body 16c can move the pure water supply nozzle 51 so that a region (projection region) formed by projecting the port 52 on the surface of the wafer W held by the spin chuck 11 moves in the radial direction of the wafer W. FIG. 4A shows the movement of the projection region 32a of the port 32 included in the developer supply nozzle 31 during the development process. FIG. 4B shows the movement of the projection region 42a of the port 42 included in the atomized developer spray nozzle 41 during a pre-wetting process. In FIGS. 4A and 4B, a symbol P indicates the center of the surface of the wafer W.

Figure 2:
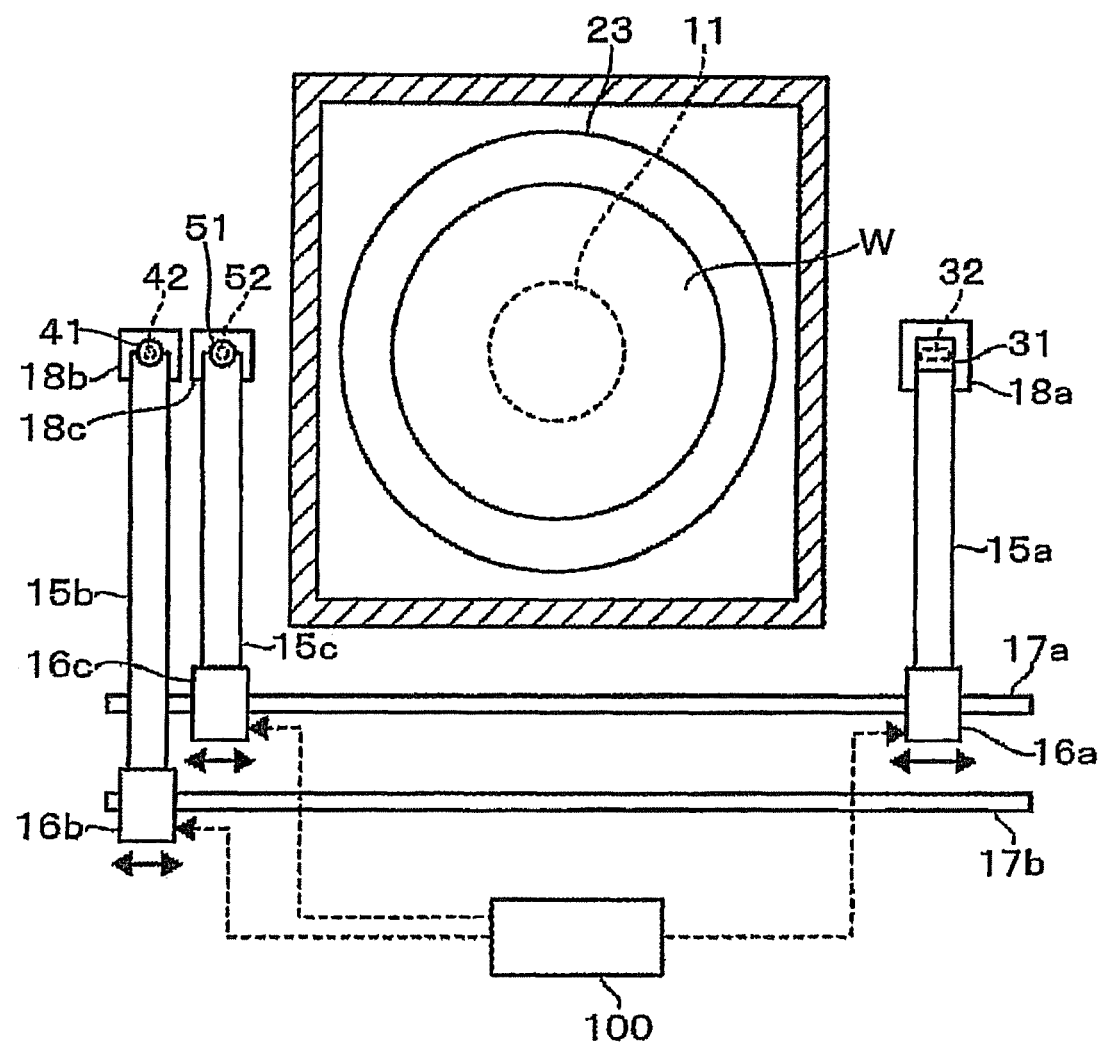
FIG. 2 is a plan view of the developing apparatus.

In FIG. 2, reference numeral 18a denotes a stand-by unit for the developer supply nozzle 31; reference numeral 18b denotes a stand-by unit for the atomized developer spray nozzle 41; and reference numeral 18c denotes a stand-by unit for the pure water supply nozzle 51. The stand-by units 18a to 18c are located on the outside of the outer cup 22. The nozzles 31, 41 and 51 stand by in the respective stand-by units 18a to 18c when each nozzle does not perform a process on the wafer W.

Next, the controller 100 is described below. The controller 100 includes a computer, for example. The controller 100 has a program storage section 91. The program storage section 91 stores a program (including, for example, software) of instructions that are to be used to perform the development process (described later). The controller 100 reads the program to control the rotational rate of the wafer, the movements of the nozzles, the supply of the developer onto the wafer W, the supply of the atomized developer onto the wafer W, the supply of the pure water onto the wafer W and the like. The program storage section 91 has a storage medium 92 such as a hard disk, a compact disc, a magnet optical disk, a memory card or the like. The program is stored in the storage medium 92.

The wafer W transferred in the developing apparatus 1 has a resist film coated thereon and exposed to light through a predetermined pattern. The resist film has a water-repellent property. A static contact angle of the resist film with respect to water is 80 degrees or more, for example. The diameter of the wafer W is in a range of 300 mm to 450 mm, for example.

The following describes procedures of the development process that is performed on the wafer W by the developing apparatus 1, with reference to FIGS. 5(a) to 5(f) and FIGS. 6(a) and 6(b).

(Step S1: Transfer of Wafer)

After the wafer W is transferred into the developing apparatus 1 by the substrate transfer unit (not shown), the wafer W is transferred onto the spin chuck 11 by the cooperative operation of both the substrate transfer unit and the lifting pin (not shown). Then, the outer cup 22 and the inner cup 23 are placed at upper positions. The spin chuck 11 then rotates at a predetermined rotational rate of, for example, 50 rpm to 100 rpm, and the atomized developer spray nozzle 41 moves from the stand-by unit 18b toward a position located above the central portion of the surface of the wafer W and is placed above the central portion of the surface of the wafer W (FIG. 5(a)). An ultrasonic wave is applied to the developer stored in the atomizing section 40 so that an atomized developer M is formed.

(Step S2: Start of Pre-Wetting Process Using Atomized Developer)

The $N_2$ gas is supplied into the atomizing section 40. The controller 100 controls the valve V1 to cause the valve V1 to be open when the $N_2$ gas is supplied into the atomizing section 40. The atomized developer M stored in the atomizing section 40 is supplied into the atomized developer spray nozzle 41 by means of the $N_2$ gas. The atomized developer spray nozzle 41 then supplies the atomized developer M and the $N_2$ gas onto the wafer W (FIG. 5(b)).

(Step S3: Pre-Wetting Process on Entire Surface of Wafer)

The atomized developer spray nozzle 41 moves from the position located above the central portion of the surface of the wafer W toward a position located above the edge portion of the surface of the wafer W while supplying the atomized developer M onto the entire surface of the wafer W. In this way, the pre-wetting process is performed (FIG. 5(c)). The atomized developer M supplied onto the wafer W is in the form of mist or in the form of particles. The surface tension of the atomized developer M on the resist is lower than that of the developer (that is in the form of a liquid) on the resist. Therefore, the atomization suppresses the fact that the developer gathers on a certain, portion (of the resist formed on the surface of the wafer) on which the developer has high wettability with the developer. Thus, the atomized developer is supplied onto the entire surface of the wafer W in a highly uniform manner. As a result, the wettability of the entire surface of the wafer W with the developer is improved.

(Step S4: Start of Supply of Developer)

The valve V1 is then closed to stop the supply of the atomized developer M and the $N_2$ gas from the atomized developer spray nozzle 41. The atomized developer spray nozzle 41 returns back to the stand-by unit 18b, and the developer supply nozzle 31 moves from the stand-by unit 18a toward a position located above the edge portion of the surface of the wafer W and is placed above the edge portion of the surface of the wafer W. The wafer W rotates at a rotational rate of, for example, 100 rpm, and the developer supply nozzle 31 supplies the developer D onto the edge portion of the surface of the wafer W from the slit-like port 32 (FIG. 5(d)).

(Step S5: Formation of Liquid Film Made of Developer)

The developer supply nozzle 31 moves toward the position located above the central portion of the surface of the wafer while supplying the developer D. Thus, the developer D is supplied from the edge portion of the surface of the wafer W to the central portion of the surface of the wafer W so that a region onto which the developer D is supplied spirally extends. The developer supply nozzle 31 stops at the position located above the central portion of the surface of the wafer W while supplying the developer D onto the wafer W, and the wafer W rotates at a rotational rate of, for example, 2000 rpm. The developer D spreads on the entire surface (whose wettability is improved by the atomized developer M attached to the surface of the wafer W) of the rotating wafer W due to the centrifugal force of the rotating wafer W to form a liquid film E made of the developer D (FIG. 5(e)). The developer D flows into the resist.

(Step S6: Stop of Supply of Developer)

After the developer supply nozzle 31 stops at the position located above the central portion of the surface of the wafer W, a predetermined time elapses. After that, the supply of the developer D is stopped. The developer supply nozzle 31 then returns back to the stand-by unit 18a, and the pure water supply nozzle 51 moves from the stand-by unit 18c toward a position located above the central portion of the surface of the wafer W (FIG. 5(f)).

(Step S7: Cleaning of Wafer)

The pure water supply nozzle 51 supplies the pure water F as a cleaning liquid onto the wafer W. The pure water W spreads toward the outer portion of the surface of the wafer W due to the centrifugal force of the rotating wafer W. A property of a soluble portion (of the resist film) is changed due to the developer D and flows away from the surface of the wafer W due to the supply of the pure water F. Then, an insoluble portion remains in the resist film to form a pattern (FIG. 6(a)).

(Step S8: Dry Process)

After the start of the supply of the pure water F, a predetermined time elapses. After that, the supply of the pure water F is stopped, and the pure water supply nozzle 51 returns back to the stand-by unit 18c. The pure water F is drained off from the wafer W due to the rotation of the wafer W so that the wafer W becomes dry (FIG. 6(b)). After that, the rotation of the wafer W is stopped. The outer cup 22 and the inner cup 23 then move down. The wafer W is transferred to the outside of the developing apparatus 1 by the substrate transfer unit (not shown). The developing process is terminated.

The developing apparatus 1 includes the atomizing section 40 and the atomized developer spray nozzle 41. The atomizing section 40 atomizes the developer (used in the pre-wetting process) in order to improve the wettability of the surface of the wafer W with the developer so that the atomized developer is generated. The atomized developer spray nozzle 41 sprays the atomized developer onto the wafer W. The surface tension of the atomized developer on the wafer W is lower than that of the developer (that is in the form of a liquid) on the wafer W. Therefore, the atomization suppresses the fact that the developer gathers on a certain portion of the surface of the wafer W. Thus, the developer can be easily supplied onto the entire surface of the wafer W, and the wettability can be improved. As a result, the developer is supplied onto the entire surface of the wafer W in a highly uniform manner. Thus, the atomization suppresses generation of an abnormally developed portion and suppresses a reduction in yield of wafers. In addition, the amount of the developer is reduced compared with the case where a large amount of the developer is supplied onto the entire surface of the wafer. Thus, the cost and the time for supplying the developer can be reduced. Therefore, the throughput can be improved.

The inventors of the present invention verified that: a portion of the resist is not dissolved into the developer only by contacting the portion of the resist with the developer; the developer remains on the surface of the resist film; and there is a tendency that the portion of the resist is dissolved into the developer when the cleaning liquid such as pure water is supplied onto the wafer W after the supply of the developer and the solution of the portion of the resist progresses. In some cases, a time required for the actual development process is longer than that (for the development process) estimated on the basis of material composition of the resist. The inventors consider that in this case, the development is affected by this effect (solution) and it takes time for the developer to flow into the resist in a vertical direction (direction in which the depth of the resist film is measured). In addition, the inventors consider that when the resist pattern is finer, this effect is more significant. In order to avoid the effect, suppressions of the amount of the developer and the time need for the development process are required. For these requirements, the developer and the pure water are alternately supplied onto the wafer W by the developing apparatus 1. The method for alternately supplying the developer and the pure water onto the wafer W is described with FIGS. 7(a) to 7(f), FIG. 8, and FIGS. 9(a) to 9(c).

Figure 7:
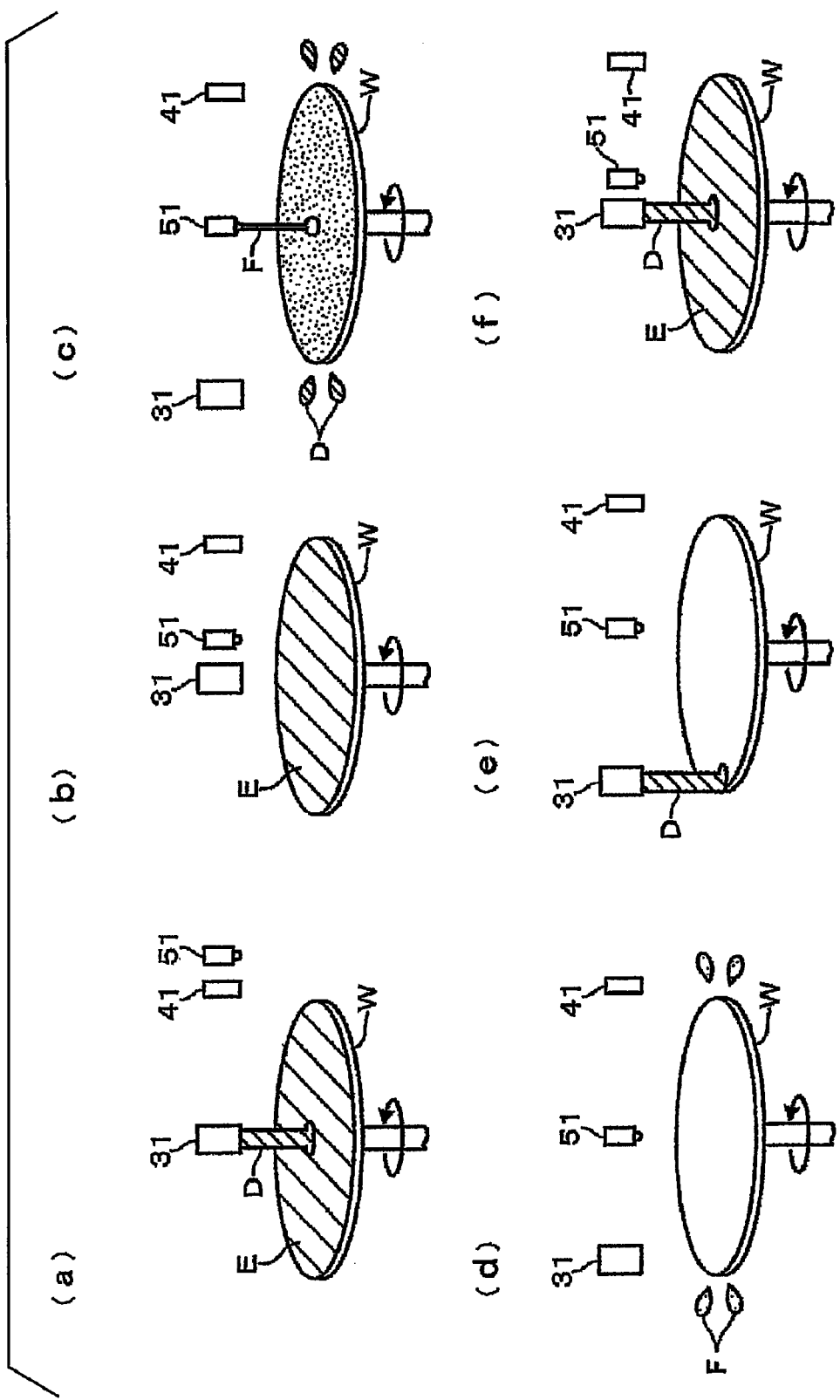
FIGS. 7(a) to 7(f) are diagrams showing another development process that is performed by the developing apparatus.
Figure 8:
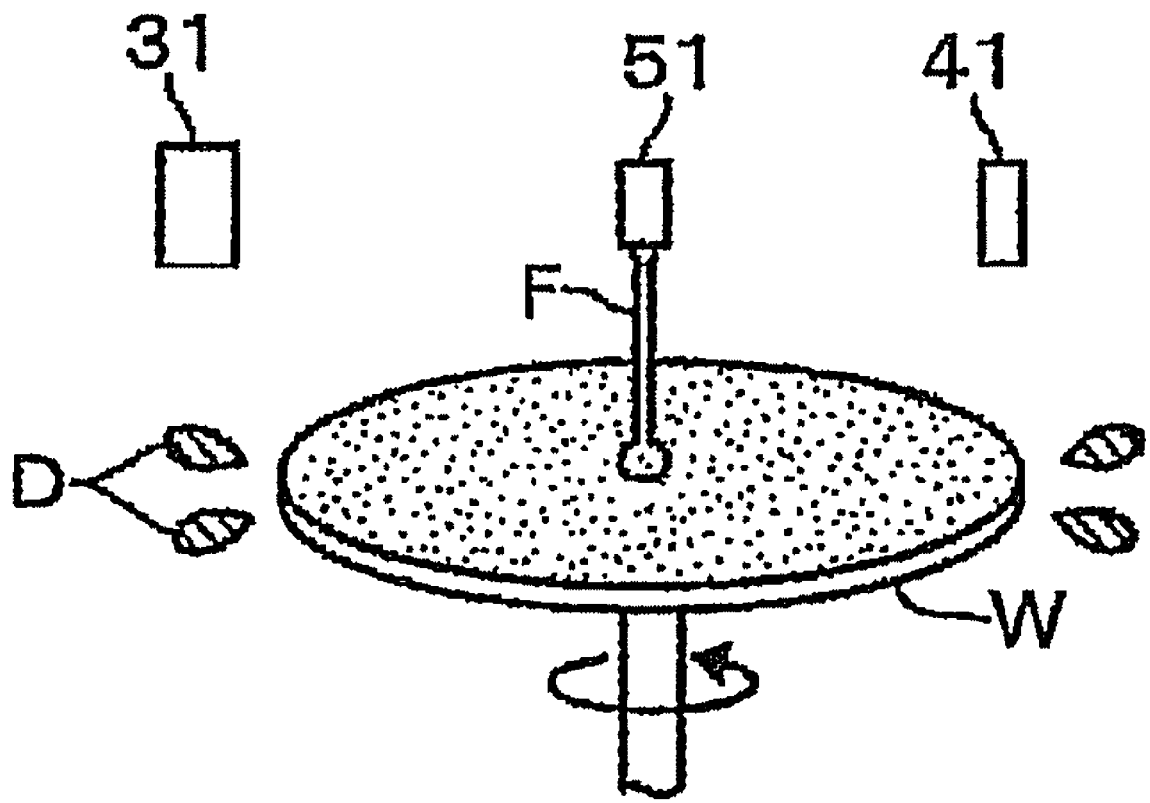
FIG. 8 is a diagram showing the other development process that is performed by the developing apparatus.
Figure 9:
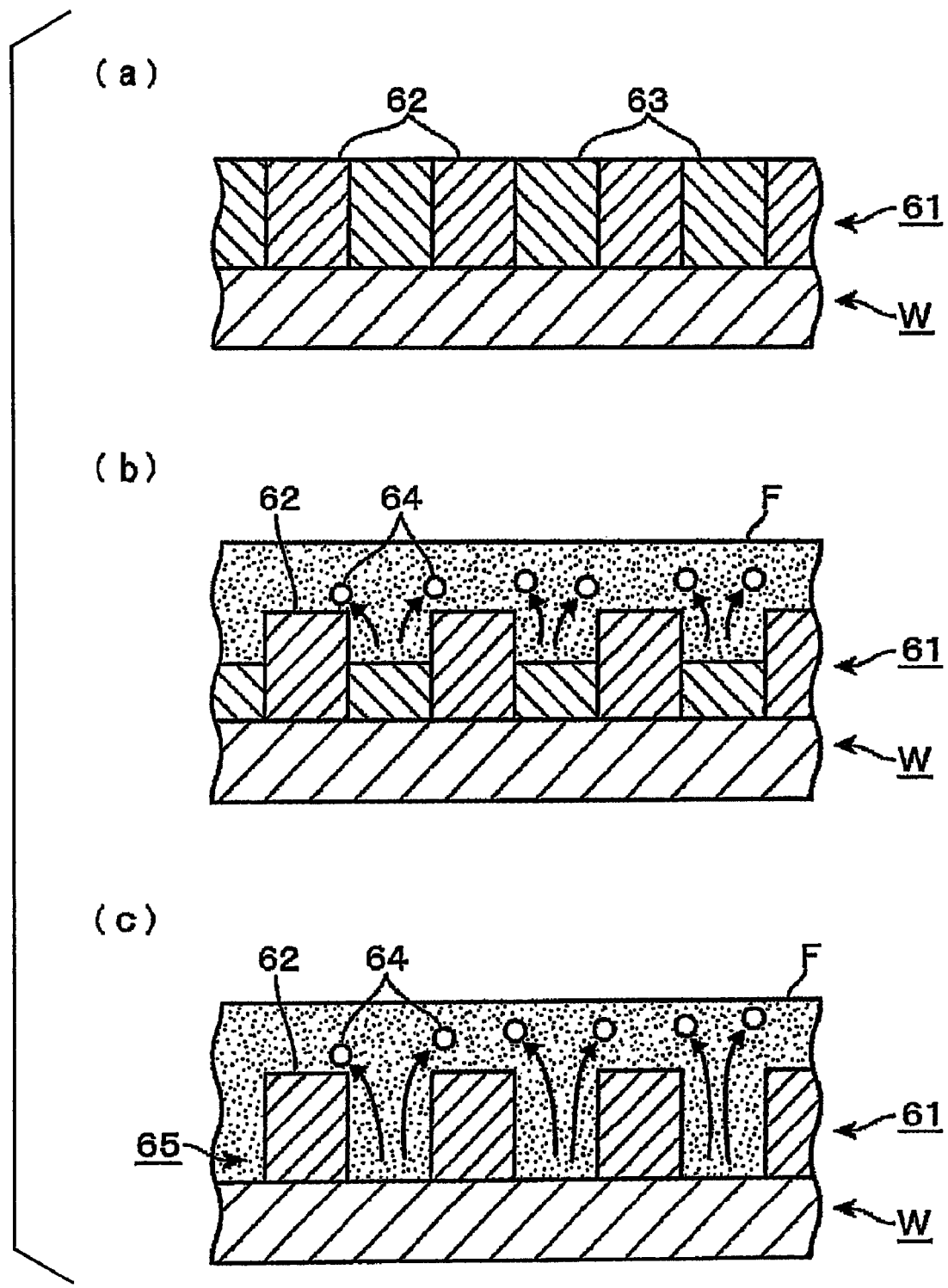
FIGS. 9(a) to 9(c) are schematic diagrams showing changes in the surface of a wafer in the development process.

FIGS. 7(a) to 7(f) and FIG. 8 are diagrams showing the development process. FIGS. 9(a) to 9(c) show changes in the surface of the wafer W in the development process. FIG. 9(a) shows the wafer W that is transferred in the developing apparatus 1 and is not subjected to the development process. In FIGS. 9(a) to 9(c), reference numeral 61 denotes the resist film; reference numeral 62 denotes a portion that is insoluble in the developer; and reference numeral 63 denotes a portion that is soluble in the developer.

According to steps S1 to S4 described above, the developer supply nozzle 31 starts supplying the developer after the pre-wetting process. The developer supply nozzle 31 moves toward the position located above the central portion of the surface of the wafer W while supplying the developer D. When the developer supply nozzle 31 is placed above the central portion of the surface of the wafer W, the rotational rate of the wafer W is increased in the same way as step S5. The developer D spreads on the entire surface of the wafer W to form a liquid film E made of the developer D (step T1: FIG. 7(a)).

The developer supply nozzle 31 stops at the position located above the central portion of the surface of the wafer W. After that, the pure wafer supply nozzle 51 moves from the stand-by unit 18c toward the position located above the central portion of the surface of the wafer W, and the supply of the developer D is stopped (step T2: FIG. 7(b)).

The developer supply nozzle 31 moves toward the position located above the edge portion of the surface of the wafer W, while the pure water supply nozzle 51 is placed above the central portion of the surface of the wafer W. The pure water supply nozzle 51 then supplies the pure water onto the central portion of the surface of the wafer W. The pure water F spreads toward the edge portion of the surface of the wafer W due to the centrifugal force of the wafer W (step T3: FIG. 7(c)). This state of the surface of the wafer W is shown in FIG. 9(b). In FIGS. 9(a) to 9(c), reference numeral 64 denotes a dissolved resist portion. In this way, a surface portion of the soluble portion 63 contacts the developer D, and is dissolved into the developer D and rinsed and removed from the resist film 61.

After the pure water supply nozzle 51 supplies the pure water for a predetermined time, the pure water supply nozzle 51 stops supplying the pure water. The pure water supply nozzle 51 then moves toward a position located above the edge portion of the surface of the wafer W, and the pure water is drained off from the wafer W (step T4: FIG. 7(d)). A predetermined time elapses after the pure water supply nozzle 51 stops supplying the pure water. Then, the rotational rate of the wafer W is reduced, and the developer supply nozzle 31 supplies the developer D onto the edge portion of the surface of the wafer W (step T5: FIG. 7(e)). The developer supply nozzle 31 moves toward the position located above the central portion of the surface of the wafer W while supplying the developer D. In the same way as step T1, when the developer supply nozzle 31 is placed above the central portion of the surface of the wafer W, the rotational rate of the wafer W is increased. Then, the developer D spreads on the entire surface of the wafer W to form a liquid film E made of the developer D on the entire surface of the wafer W again (step T6: FIG. 7(f)).

After the developer supply nozzle 31 is placed above the central portion of the surface of the wafer W, a predetermined time elapses. After that, the developer supply nozzle 31 stops supplying the developer D. The developer supply nozzle 31 moves to the stand-by unit 18a, and the pure water supply nozzle 51 is placed above the central portion of the surface of the wafer W. The pure water supply nozzle 51 supplies the pure water F onto the central portion of the surface of the wafer W. The pure water F spreads toward the edge portion of the surface of the wafer W due to the centrifugal force of the wafer W (step T7: FIG. 8). FIG. 9(c) shows the surface of the wafer W subjected to step T7. As shown in FIG. 9(c), the soluble portion 63 that contacts the developer D is dissolved into the developer D so that a resist pattern 65 is formed. The dissolved resist portion 64 is rinsed and removed from the resist film 61 by means of the pure water F. After the surface of the wafer W is cleaned, a dry process is performed on the wafer W according to step S8 described above.

The development process suppresses generation of a region that is not developed. In addition, after the surface of the soluble portion that contacts the developer is removed, the developer is re-supplied so that the surface of the remaining soluble portion that contacts the re-supplied developer is removed. Thus, the developer can efficiently contact the soluble portion. Therefore, the amount of the developer can be reduced, and the time required for the development process can be suppressed. Furthermore, the wafer can be developed with high resolution. The supply of the developer and the supply of the pure water may be alternately repeated two or more times.

Figure 10:
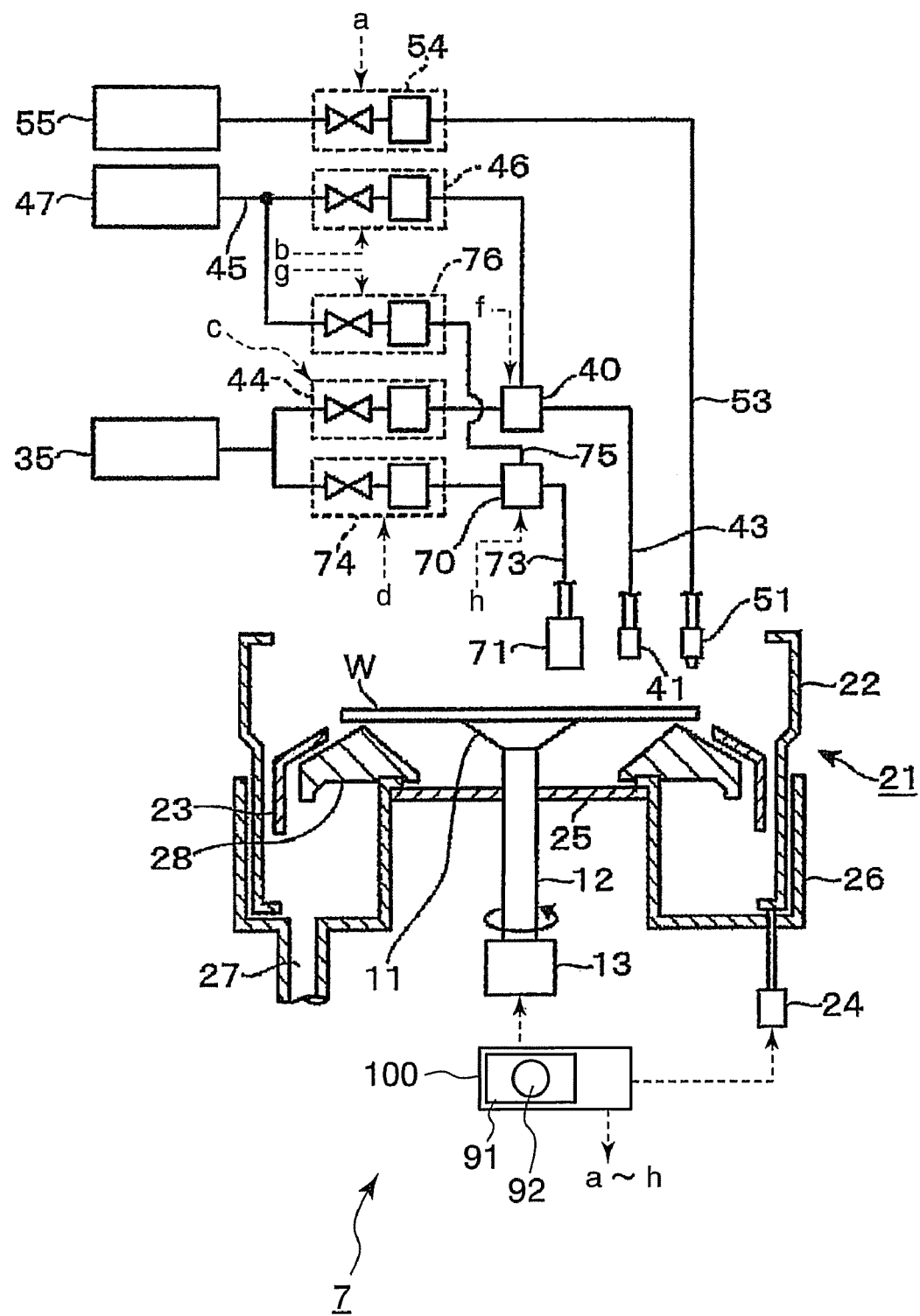
FIG. 10 is a vertical cross sectional view of another developing apparatus.

Next, a developing apparatus 7 that performs another development process is described below. In the following description, differences between the developing apparatus 7 and the developing apparatus 1 are mainly explained. As shown in FIG. 10, the developing apparatus 7 has an atomized developer spray nozzle 71 (second spray nozzle) connected to an atomized developer supply pipe 73. An upstream-side end of the atomized developer supply pipe 73 is connected to the atomized developer supply pipe 43 on the upstream side of the flow rate controller 44 through an atomizing section 70 (developer atomizing unit) and a flow rate controller 74.

The atomizing section 70 has the same configuration as the atomizing section 40. The atomizing section 70 is connected to an end of a gas supply pipe 75. The other end of the gas supply pipe 75 is connected to an upstream-side end of the flow rate controller 46 (connected to the gas supply pipe 45) through a flow rate controller 76. The flow rate controller 74 has the same configuration as the flow rate controller 44. The flow rate controller 76 has the same configuration as the flow rate controller 46.

Figure 11:
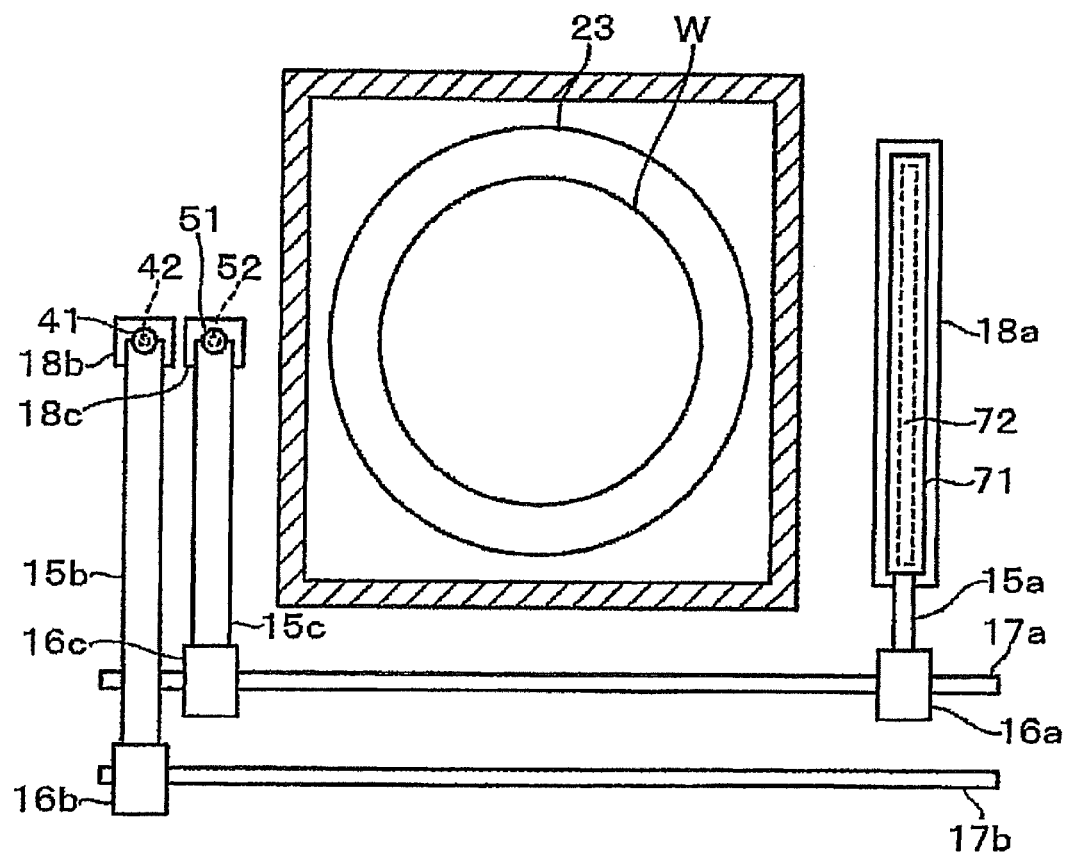
FIG. 11 is a horizontal cross sectional view of the developing apparatus shown in FIG. 10.
Figure 12A:
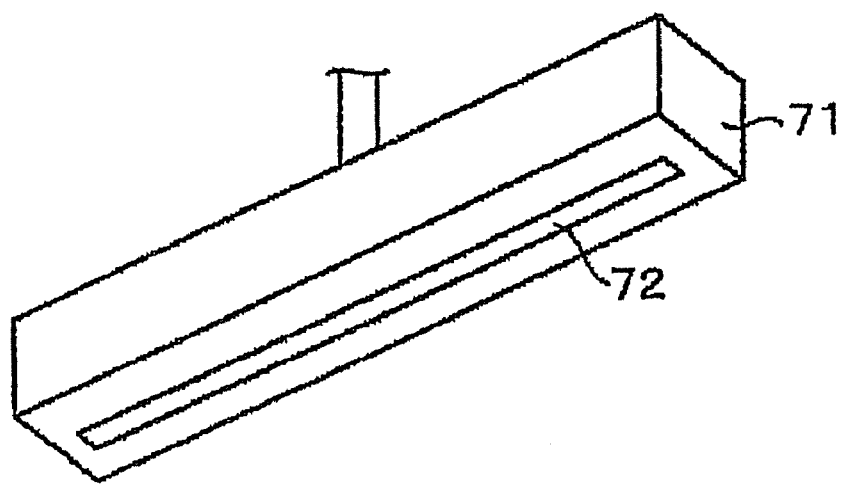
FIGS. 12A and 12B are perspective views of a developer spray nozzle included in the developing apparatus shown in FIG. 10.
Figure 12B:
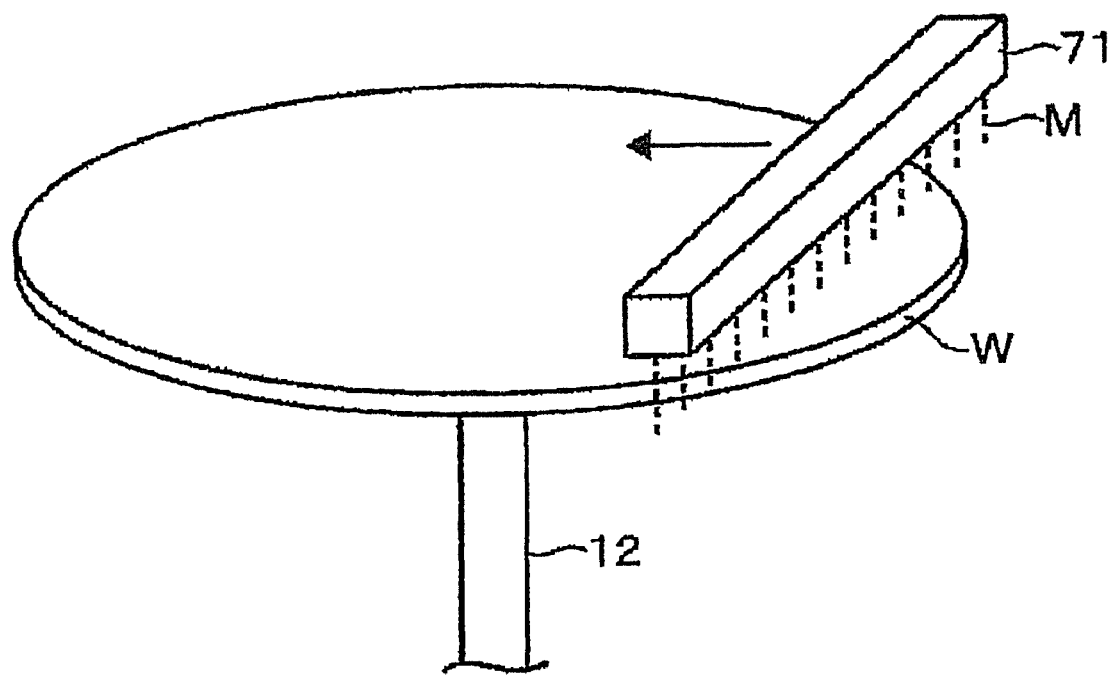

As shown in FIG. 11, the atomized developer spray nozzle 71 is provided instead of the developer supply nozzle 31. The atomized developer spray nozzle 71 is connected to the movable body 16a through the nozzle arm (support section) 15a. As shown in FIG. 12A, the atomized developer spray nozzle 71 has a slit-like port 72. The port 72 is open downwardly. As shown in FIG. 12B, the length of a longer side of the port 72 is larger than the diameter of the wafer W so that when the atomized developer spray nozzle 71 moves above the wafer W in a horizontal direction, atomized developer spray nozzle 71 can supply the atomized developer M onto the entire surface of the wafer W.

An example of the development process performed by the developing apparatus 7 is described below. First, the developing apparatus 7 performs steps S1 to S3 described above. The developing apparatus 7 performs the pre-wetting process on the wafer W. After that, the rotation of the wafer W by the spin chuck 11 is stopped. Then, the atomized developer spray nozzle 71 is positioned above the edge portion of the surface of the wafer W. The atomized developer spray nozzle 71 moves toward the opposite edge of the surface of the wafer W while spraying the atomized developer M so that the atomized developer M is supplied onto the entire surface of the wafer W. The density of the atomized developer M sprayed in the development process is higher than that sprayed in the pre-wetting process and sufficient to develop the wafer W.

The affinity of the surface of the wafer for the atomized developer M is increased by the pre-wetting process. Therefore, the atomized developer M supplied from the atomized developer spray nozzle 71 is efficiently attached to the surface of the wafer and the density of the atomized developer M located on the surface of the wafer W is increased. Thus, a property of the surface of the wafer W is changed so that the wafer W is developed. After that, the wafer W is cleaned according to step S7 so that the soluble portion of the resist film is removed. Then, the wafer W is subjected to the dry process according to step S8.

The supply of the atomized developer M by the atomized developer spray nozzle 71 and the supply of the pure water by the pure water supply nozzle 51 may be alternately repeated in the developing apparatus 7, similar to the developing apparatus 1. In addition, the shape of the nozzle that supplies the atomized developer to develop the wafer W is not limited to the shape described in the above example. The atomized developer spray nozzle 71 described in the above example supplies a lot of the atomized developer onto a wide region of the surface of the wafer W. Thus, the shape of the atomized developer spray nozzle 71 described above is effective to perform the development process using the atomized developer. The atomized developer spray nozzle 71 may supply the atomized developer while the wafer W rotates in the development process in the same way as the pre-wetting process. A surface treatment liquid used in the pre-wetting process is not limited to the developer. Pure water, or a mixed liquid containing pure water and the developer may be used as the surface treatment liquid in the pre-wetting process.

Figure 13:
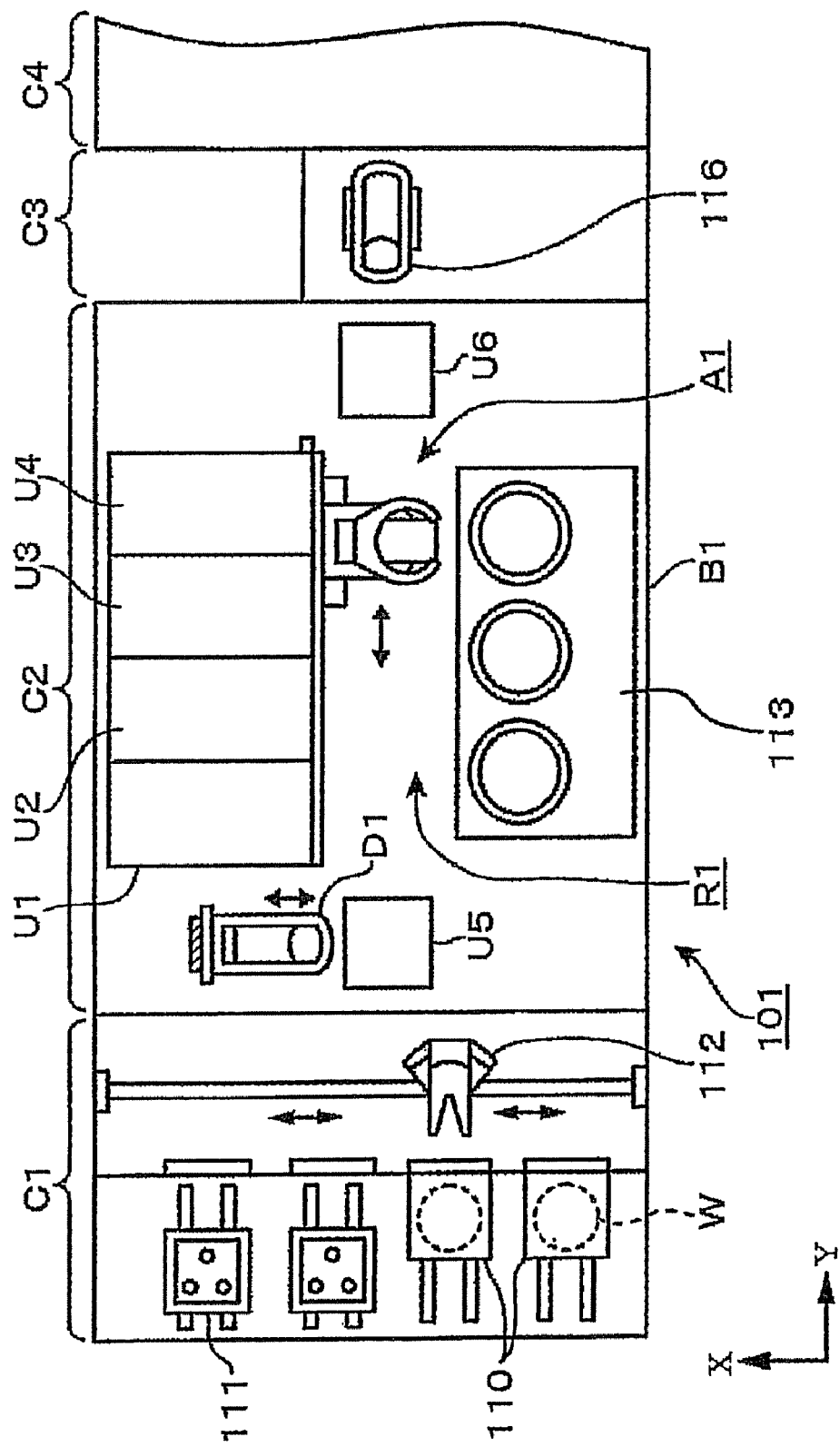
FIG. 13 is a plan view of a coating and developing apparatus having the developing apparatus shown in FIG. 1 or 10.
Figure 14:
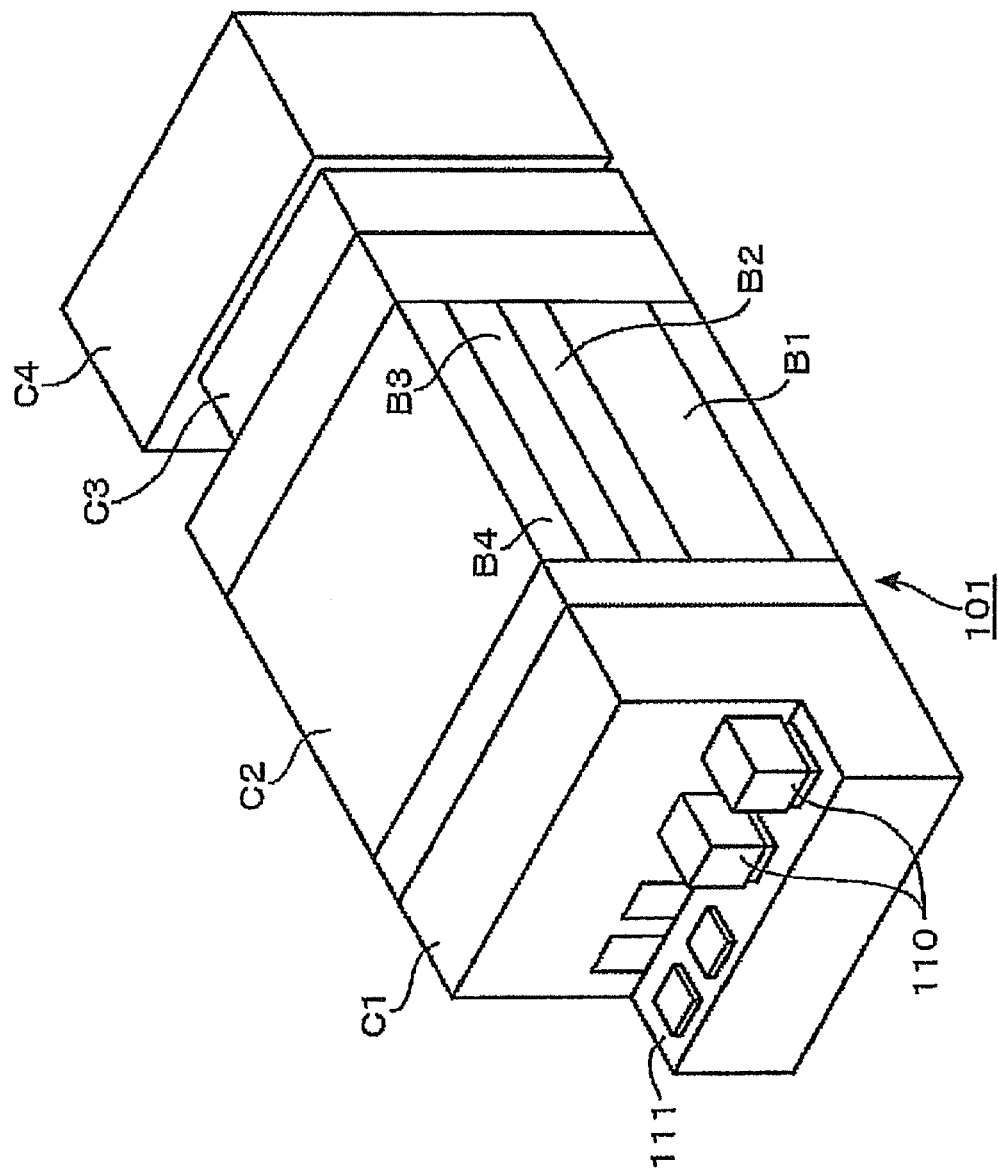
FIG. 14 is a perspective view of the coating and developing apparatus.
Figure 15:
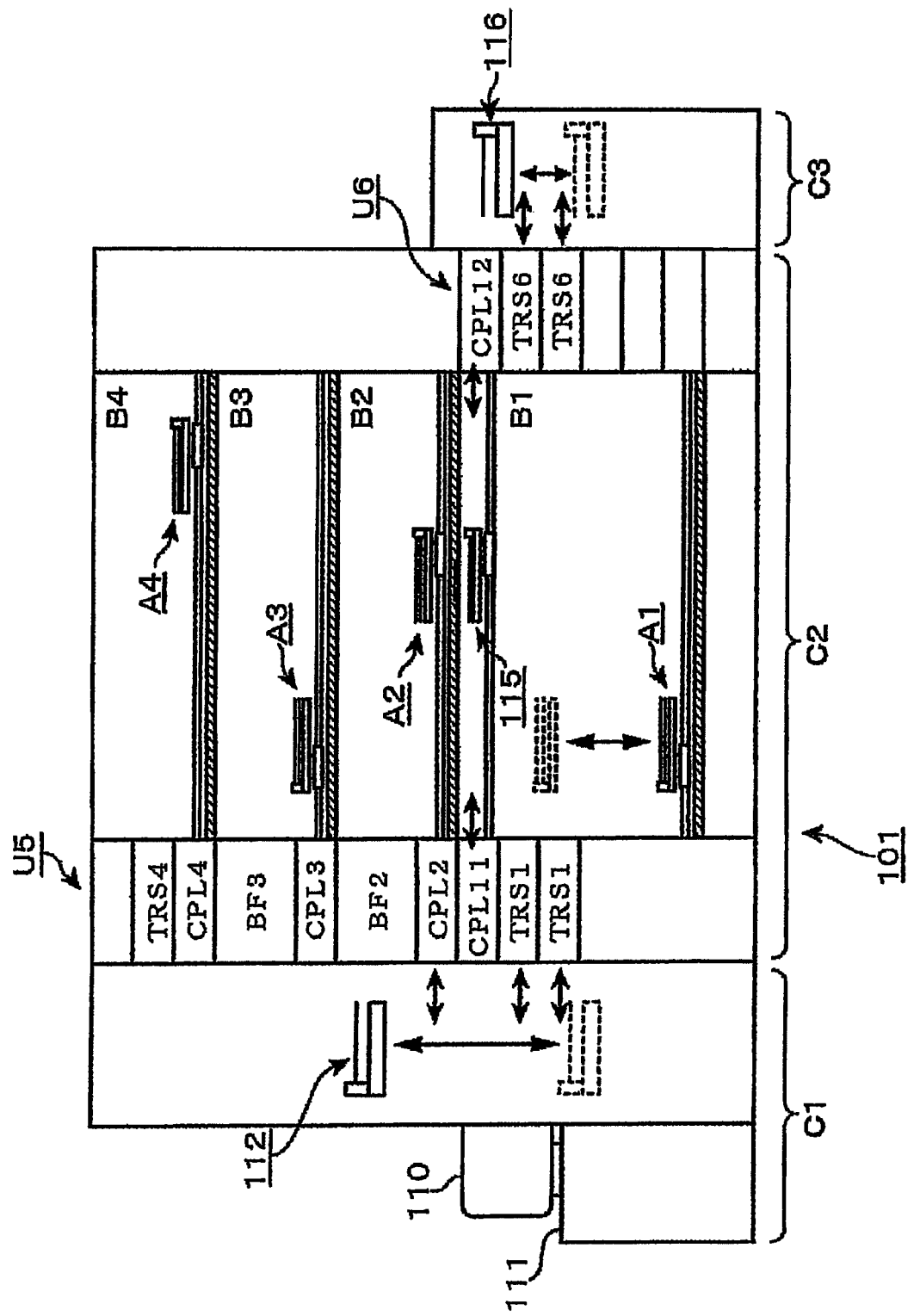
FIG. 15 is a vertical cross sectional view of the coating and developing apparatus.

The following describes a coating and developing apparatus 101 including the developing apparatus 1 or 7. FIG. 13 is a plan view of a resist pattern formation system having the coating and developing apparatus 101 and an exposure apparatus C4. The coating and developing apparatus 101 is connected to the exposure apparatus C4. The exposure apparatus C4 performs immersion exposure, for example. FIG. 14 is a perspective view of the resist pattern formation system shown in FIG. 13. FIG. 15 is a vertical cross sectional view of the coating and developing apparatus 101. The coating and developing apparatus 101 has a carrier block C1. The carrier block C1 has a stage 111. The stage 111 mounts a sealed type carrier 110 thereon. The wafer W is taken out of the sealed type carrier 110 by a transfer arm 112. The transfer arm 112 transfers the wafer W to a treatment block C2. The wafer W is treated in the treatment block C2. The transfer arm 112 receives the treated wafer W and returns the wafer W back to the carrier 110. The carrier 110 is capable of holding a plurality of wafers W. The wafers W are sequentially transferred to the treatment block C2.

As shown in an example illustrated in FIG. 14, the treatment block C2 has a first block (DEV layer) B1, a second block (BCT layer) B2, a third block (COT layer) B3 and a fourth block (ITC layer) B4 laminated in this order from the bottom of the treatment block C2. The first block (DEV layer) B1 performs a development process. The second block (BCT layer) B2 performs a process for forming an antireflective film under a resist film. The third block (COT layer) B3 coats the resist film on the wafer W. The fourth block (ITC layer) B4 forms a protective film on or above the resist film.

Each of the layers included in the treatment block C2 is configured in a similar way to the first block B1 shown in the plan view of FIG. 8. The third block (COT layer) B3 is explained as an example. The third block (COT layer) B3 includes a resist film formation module, shelf units U1 to U4 and a transfer arm A3. The resist film formation module included in the third block B3 forms a resist film as a coated film. The shelf units U1 to U4 included in the third block B3 form a heating/cooling treatment module group that performs processes before and after the formation process performed by the resist film formation module. The transfer arm A3 is located between the resist film formation module and the heating/cooling treatment module and transfers the wafer W between the resist film formation module and the heating/cooling treatment module.

The shelf units U1 to U4 included in the third block B3 are arranged along a transfer region R1 in which the transfer arm A3 moves. Each of the shelf units U1 to U4 includes a heating module and a cooling module, which are laminated. Each heating module includes a heating plate that heats the wafer W placed on the heating plate. Each cooling module includes a cooling plate that cools the wafer W placed on the cooling plate.

Each of the second blocks (BCT layers) B2 and the fourth blocks (ITC layers) B4 has an antireflective film formation module and a protective film formation module, which correspond to the resist film formation module. Each antireflective film formation module supplies a chemical liquid (for formation of the antireflective film) onto the wafer W as a treatment liquid instead of the resist. Each protective film formation module supplies a chemical liquid (for formation of the protective film) onto the wafer W as a treatment liquid instead of the resist. Other configurations of each of the second blocks (BCT layers) B2 and the fourth blocks (ITC layers) B4 are the same as those of each third block (COT layer) B3.

The first block (DEV layer) B1 has two development modules 113 (corresponding to the resist film formation module) laminated. Each development module 113 has three development sections (corresponding to the developing apparatus 1 or 7) and a housing that houses the development sections and is shared by the development sections. The first block (DEV layer) B1 includes the shelf units U1 to U4 that form a heating/cooling treatment module group that performs processes before and after processes performed by the development modules 113. The first block (DEV layer) B1 has a transfer arm A1 that transfers the wafer W between the two development modules 113 and the heating/cooling treatment module. The transfer arm A1 is shared by the two development modules and corresponds to the aforementioned substrate transfer unit.

The treatment block C2 also includes a shelf unit U5 as shown FIGS. 13 and 15. The shelf unit 5 has transfer units. One of the transfer units included in the shelf unit 5 is a transfer unit CPL2 that is provided for the second block (BCT layer) B2. The wafer W is transferred to the transfer unit CPL2, for example. The second block (BCT layer) B2 includes a transfer arm A2. The transfer arm A2 receives the wafer W from the transfer unit CPL2 and transfers the wafer W to the units (antireflective film formation module and heating/cooling treatment module group). The units form the antireflective film on the wafer W.

After that, the wafer W is transferred through a transfer unit BF2 and a transfer arm D1 to a transfer unit CPL3. The transfer unit BF2 and the transfer unit CPL3 are included in the shelf unit U5. The temperature of the wafer W is adjusted to, for example, 23 degrees C. in the transfer unit CPL3. Then, the wafer W is transferred to the third block (COT layer) B3 through a transfer arm A3 included in the third block (COT layer) B3. The wafer W is then transferred to the resist film formation module. The resist film is formed on the wafer W in the resist film formation module. The wafer W is then transferred from the transfer arm A3 to a transfer unit BF3 included in the shelf unit U5. In the fourth block (ITC layer) B4, the protective film is formed on the wafer W having the resist film formed thereon in some cases. In this case, the wafer W is transferred through a transfer unit CPL4 (included in the shelf unit U5) to a transfer arm A4 (included in the fourth block (ITC layer) B4). After the protective film is formed on the wafer W, the wafer W is transferred from the transfer arm A4 to a transfer unit TRS4.

The first block (DEV layer) B1 includes a shuttle arm 115. The shuttle arm 115 serves as a dedicated transfer arm to transfer the wafer W directly from a transfer unit CPL11 to a transfer unit CPL12. The transfer unit CPL11 is included in the shelf unit U5 and the transfer unit CPL12 is included in a shelf unit U6. The wafer W having the resist film (and the protective film) formed thereon is transferred through the transfer arm D1, the transfer unit BF3 and the transfer unit TRS4 to the transfer unit CPL11. The wafer W is directly transferred from the transfer unit CPL11 to the transfer unit CPL12 through the shuttle arm 115. The wafer W is then transferred from the transfer unit CPL12 into an interface block C3. Each of the transfer units (shown in FIG. 15) denoted by the symbol starting with "CPL" also serves as a cooling unit for temperature adjustment. Each of the transfer units (shown in FIG. 15) denoted by the symbol starting with "BF" also serves as a buffer unit capable of mounting a plurality of wafers W.

The wafer W is then transferred to the exposure apparatus C4 by an interface arm 116. The exposure apparatus C4 performs a predetermined exposure process on the wafer W. After the exposure process, the wafer W is placed on a transfer unit TRS6 included in the shelf unit U6 and then returned back to the treatment block C2. The wafer W is then subjected to the developing process in the first block (DEV layer) B1. The wafer W is then transferred to a transfer unit TRS1 included in the shelf unit U5 by the transfer arm A1. After that, the wafer W is returned back to the carrier 110 through the transfer arm 112.

What is claimed is:

1. A developing apparatus comprising:
   a substrate holder that holds a substrate, the substrate being prepared by coating a surface of the substrate with a resist and exposing the resist-coated substrate to light, such that the substrate is capable of rotating around a vertical rotational axis and is horizontally oriented;
   means for atomizing a surface treatment liquid that includes a tank storing the surface treatment liquid used to improve wettability of the substrate with a developer and an oscillator applying an ultrasonic wave to the surface treatment liquid stored in the tank so as to generate an atomized surface treatment liquid, wherein the diameter of a particle of the atomized surface treatment liquid is 3 μm or less, and the surface treatment liquid atomizing means is connected to a carrier gas supply section which supplies a carrier gas that transfers the atomized surface treatment liquid;
   a first spray nozzle that is connected to the surface treatment liquid atomizing means, the first spray nozzle spraying the atomized surface treatment liquid onto the substrate;
   a transfer mechanism that moves the first spray nozzle between a position located above a central portion of the substrate and a position located above an edge portion of the substrate held by the substrate holder;
   means for atomizing the developer;
   a second spray nozzle that is connected to the developer atomizing means, the second spray nozzle spraying the atomized developer for development onto the substrate, wherein the surface treatment liquid includes the developer, and a density of the atomized developer from the second spray nozzle is higher than a density of the developer included in the surface treatment liquid;
   a cleaning nozzle that is located above the substrate held by the substrate holder, the cleaning nozzle supplying a cleaning liquid onto the substrate to which the developer has been supplied to clean the substrate; and
   a control unit that controls an operation of the second spray nozzle and an operation of the cleaning nozzle, wherein the control unit controls the second spray nozzle and the cleaning nozzle so that a step of supplying the atomized developer from the second spray nozzle onto the substrate and a step of supplying the cleaning liquid from the cleaning nozzle onto the substrate are alternately repeated.

2. The developing apparatus according to claim 1, wherein the surface treatment liquid atomizing means further includes a flow rate controller that controls a flow rate of the carrier gas which is supplied from the carrier gas supply section to an atomizing section;
   wherein the control unit outputs a control signal relevant to the flow rate of the carrier gas, to the flow rate controller.

* * * * *